United States Patent [19]

Nishi et al.

[11] Patent Number: 5,660,967
[45] Date of Patent: Aug. 26, 1997

[54] PHOTOSENSITIVE RESIN COMPOSITION AND METHOD FOR FORMING PHOTORESIST PATTERN USING THE SAME

[75] Inventors: Mineo Nishi; Koji Nakano; Yoshihiro Takada, all of Kitakyushu, Japan

[73] Assignee: Mitsubishi Chemical Corporation, Tokyo, Japan

[21] Appl. No.: 579,269

[22] Filed: Dec. 27, 1995

[30] Foreign Application Priority Data

Dec. 27, 1994 [JP] Japan .................................. 6-325875

[51] Int. Cl.⁶ .................... G03F 7/023; G03F 7/30
[52] U.S. Cl. .................... 430/190; 430/192; 430/193; 430/326
[58] Field of Search ................. 430/190, 165, 430/192, 193, 326

[56] References Cited

U.S. PATENT DOCUMENTS

| | | | |
|---|---|---|---|
| 5,110,706 | 5/1992 | Yumoto et al. | 430/191 |
| 5,279,918 | 1/1994 | Nishi et al. | 430/190 |
| 5,372,909 | 12/1994 | Nishi et al. | 430/190 |
| 5,447,825 | 9/1995 | Nishi et al. | 430/190 |
| 5,478,691 | 12/1995 | Miyashita et al. | 430/190 |
| 5,529,880 | 6/1996 | Zampini et al. | 430/190 |

FOREIGN PATENT DOCUMENTS

| | | |
|---|---|---|
| 0 455 228 | 11/1991 | European Pat. Off. . |
| 62-10646 | 1/1987 | Japan . |
| 2-137111 | 5/1990 | Japan . |
| 2-137112 | 5/1990 | Japan . |
| 2-300751 | 12/1990 | Japan . |
| 3-104053 | 5/1991 | Japan . |
| 4-144204 | 5/1992 | Japan . |
| 5289331 | 11/1993 | Japan . |

*Primary Examiner*—John S. Chu
*Attorney, Agent, or Firm*—Oblon, Spivak, McClelland, Maier & Neustadt, P.C.

[57] ABSTRACT

A photosensitive resin composition comprising an alkali-soluble resin, a quinonediazide type photosensitive compound and a solvent, in which the quinonediazide type photosensitive compound contains a quinonediazide sulfonic acid ester of a polycondensate (d) of at least one phenolic compound (a) of the formula (A) with at least one hydroxy aromatic aldehydes (b) of the formula (B) and at least one carbonyl compounds (c) of the formula (C), and the mixing ratio ((b)/(c) mol ratio) of the hydroxy aromatic aldehydes (b)/the carbonyl compounds (c) is from 1/99 to 99/1, and the polycondensate (d) has a weight average molecular weight of from 600 to 2,000 in terms of polystyrene calculation:

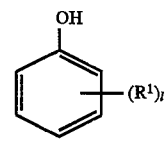

[A]

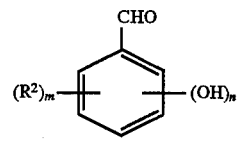

[B]

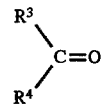

[C]

(wherein $R^1$ is an alkyl group having a carbon number of from 1 to 4, an alkoxy group having a carbon number of from 1 to 4 or a hydroxyl group, $R^2$ is an alkyl group having a carbon number of from 1 to 4 or an alkoxy group having a carbon number of from 1 to 4, $R^3$ and $R^4$ are respectively a hydrogen atom, an alkyl group having a carbon number of from 1 to 4, an aryl group or an aralkyl group, $l$ is an integer of from 0 to 3, $m$ is an integer of from 0 to 4, $n$ is an integer of from 1 to 5, and the total number of $m$ and $n$ is not more than 5, provided that plural $R^1$ or $R^2$ may be respectively the same or different when $l$ or $m$ is an integer of at least 2).

10 Claims, No Drawings

PHOTOSENSITIVE RESIN COMPOSITION AND METHOD FOR FORMING PHOTORESIST PATTERN USING THE SAME

The present invention relates to a photosensitive resin composition sensitive to radiations such as ultraviolet rays, farultraviolet rays, electron rays and X rays, which comprises an alkali-soluble novolak resin, a quinonediazide type photosensitive compound and a solvent as the main components.

Heretofore, a photoresist comprising an alkali-soluble novolak resin as a base resin and a quinonediazide type photosensitive compound having a function as an agent for inhibiting an alkali-solubility, is well known. At present, a composition generally used as a photoresist for preparing semiconductors, comprises a novolak resin as an alkali-soluble resin, a condensate (esterified material) of naphthoquinonediazide sulfonic acid chloride and hydroxybenzophenone as a photosensitive material and a solvent such as ethyl cellosolve acetate for dissolving these compounds (see Japanese Unexamined Patent Publication No. 17112/1983 and Japanese Unexamined Patent Publication No. 136637/1987). Pattern-forming processes using these photoresists are variously known, and their general principle is illustrated below. That is, at a radiation-exposed part, a quinonediazide type photosensitive compound as a photosensitive material is decomposed into ketene by way of carbene, and is reacted with water in and outside the system to form indene carboxylic acid, thus the photoresist being easily dissolved by an alkali aqueous solution. On the other hand, at an unexposed part, the solubility of an alkai-soluble novolak resin to an alkali developer is inhibited by a photosensitive material (this inhibiting effect is hereinafter referred to as "masking effect"). Accordingly, the photoresist is hardly dissolved in the alkali developer, and is not swollen and remains at a high rate, thus producing an excellent resist pattern of high resolving power.

Recently, semiconductor integrated circuits tend to be highly densified, and their production processes face difficulties. Under these circumstances, a photoresist having various high qualities is demanded, and particularly, a photoresist having a high sensitivity, a high resolution, a squareness of pattern profile, a high dry etching resistance and a high heat resistance is strongly demanded. In order to satisfy these demands, there are proposed a photoresist composition for preparing a semiconductor, which contains a condensate of a naphthoquinonediazide compound and a low molecular weight novolak resin which is different from an alkali-soluble resin as a base resin and is prepared from a ketone or aldehyde derivative with a specific phenolic compound, as a photosensitive component (Japanese Unexamined Patent Publication No. 230755/1992), a photoresist composition prepared by using benzaldehydes as an aldehyde component for a polycondensate used as a photosensitive component (Japanese Unexamined Patent Publication No. 1044/1981 and Japanese Examined Patent Publication No. 41820/1991), a photoresist composition prepared by using hydroxybenzaldehydes as aldehydes for a polycondensate used as a photosensitive component (Japanese Unexamined Patent Publication No. 300751/1990 and Japanese Unexamined Patent Publication No. 294861/1991), and a positive type photoresist composition containing a condensate of a naphthoquinonediazide compound and a low molecular weight novolak resin which is different from an alkali-soluble resin as a base resin and is prepared from hydroxy aromatic aldehydes and a specific phenolic compound, as a photosensitive component (Japanese Unexamined Patent Publication No. 289331/1993).

There are various patterns in a mask used in the production process of semiconductors, and isolated line patterns, for example line to space ratio is 1:9, and dense line patterns, for example line to space ratio is 1:1, coexist in the mask. Generally, in comparison between a dense line pattern and an isolated line pattern, each pattern having the same line width on the mask, the width of the isolated photoresist line pattern obtained after exposure tends to become thicker than the width of the dense photoresist pattern obtained after exposure due to their optical image differences between these two kinds of patterns when exposed to the same amount of light. In the case of using conventional photoresists, this difference of line width becomes more remarkable and the difference induce a serious problem when preparing more highly integrated aimed IC patterns. When the size of a photoresist pattern obtained is largely deviated from a predetermined aimed value, the deviation unfavorably affects on the electric properties of IC. Thus, a photoresist providing an accurate size of pattern along with a predetermined aimed value regardless of the kind of mask pattern, for example, isolated line pattern or dense pattern of line and space is highly demanded.

Under these circumstances, an object of the present invention is to provide a photoresist composition excellent in providing a photoresist pattern having an accurate formed size and also excellent in pattern profile, developing property, sensitivity and resolution as compared with conventional products.

In order to solve the above-mentioned conventional problems, we studied and discovered that a photoresist composition excellent in producing a photoresist pattern having an accurate formed size and also excellent in pattern profile, developing property, sensitivity and resolution as compared with conventional products, can be provided by selecting a polycondensate of a specific phenolic compound with hydroxy aromatic aldehydes and other specific carbonyl compounds, as a low molecular weight novolak resin (hereinafter referred to as "ballast resin") other than an alkali-soluble resin as a base resin, which is bonded with a naphthoquinonediazide compound as a photosensitive component.

Thus, the essential feature of the present invention results in a photosensitive resin composition comprising an alkali-soluble resin, a quinonediazide type photosensitive compound and a solvent, characterized in that the quinonediazide type photosensitive compound comprises a quinonediazide sulfonic acid ester product of a polycondensate (d) of at least one phenolic compound (a) of the formula (A) with at least one hydroxy aromatic aldehydes (b) of the formula (B) and at least one carbonyl compounds (c) of the formula (C), and the mixing ratio ((b)/(c) mol ratio) of the hydroxy aromatic aldehydes (b)/the carbonyl compounds (c) is from 1/99 to 99/1, and the polycondensate (d) has a weight average molecular weight of from 600 to 2,000 in terms of polystyrene calculation:

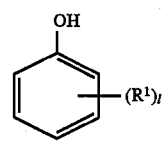

[A]

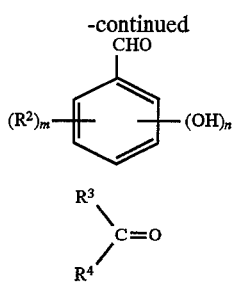

$$[B]$$

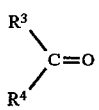

$$[C]$$

(wherein $R^1$ is an alkyl group having a carbon number of from 1 to 4, an alkoxy group having a carbon number of from 1 to 4 or a hydroxyl group, $R^2$ is an alkyl group having a carbon number of from 1 to 4 or an alkoxy group having a carbon number of from 1 to 4, $R^3$ and $R^4$ are respectively a hydrogen atom, an alkyl group having a carbon number of from 1 to 4, an aryl group or an aralkyl group, l is an integer of from 0 to 3, m is an integer of from 0 to 4, n is an integer of from 1 to 5, and the total number of m and n is not more than 5, provided that plural $R^1$ or $R^2$ may be respectively the same or different when l or m is an integer of at least 2).

Hereinafter, the present invention is further explained in more details.

In the photosensitive resin composition of the present invention, examples of the alkali-soluble resin used, include a novolak resin, a resol resin, a polyvinyl phenol resin, a polyacrylic acid resin, and the like.

The molecular weight of this alkali-soluble resin used as a base resin is larger than that of a novolak resin constituting a photosensitive compound mentioned below, and the former resin is clearly distinguished from the latter resin. That is, the weight average molecular weight of the alkali-soluble resin (analytical value based on polystyrene calculation in accordance with gel permeation chromatography method) (hereinafter referred to as "MW") is usually about from 2,500 to 30,000.

Among the above examples of the alkali-soluble resin, a novolak resin is preferable, and is not especially limited but a particularly preferable novolak resin is obtained by poly-condensating at least one monomer components selected from the group of phenols, alkyl phenols including o-cresol, m-cresol, p-cresol, 3,5-xylenol, 2,5-xylenol, 2,3-xylenol, 3,4-xylenol, 2,3,5-trimethylphenol, 3,4,5-trimethylphenol or the like, alkoxy or aryloxy phenols including 2-methoxyphenol, 4-methoxyphenol, 4-phenoxylphenol or the like, naphthols including α-naphthol, β-naphthol, 3-methyl-α-naphthol or the like, and polyhydroxy benzenes including resorcinol, 2-methylresorcinol, 4-methylresorcinol, 5-methylresorcinol, catechol, pyrogallol or the like, with at least one carbonyl compounds selected from the group of aliphatic aldehydes including formaldehyde, paraformladehyde, acetaldehyde, paraldehyde or the like, aromatic aldehydes including benzaldehyde, and alkyl ketones including acetone, by heating in the presence of an acid catalyst such as hydrochloric acid, sulfuric acid, oxalic acid or the like.

A more preferable novolak resin is obtained by polycondensating a mixture of m-cresol and p-cresol, or a mixture of m-cresol, p-cresol and at least one phenol of 2,5-xylenol, 3,5-xylenol, β-naphthol, α-naphthol and resorcinol, with formaldehyde or a mixture of formaldehyde and acetaldehyde or paraldehyde. A mixing ratio (mol ratio) of m-cresol:p-cresol:other phenols is usually 1-7:3-7:0-5.

An example of a method for producing the above-mentioned novolak resin includes a normal method such as a method comprising mixing, heating and polycondensating phenols and a carbonyl compound in the presence of an acid catalyst. Examples of the acid catalyst include an inorganic acid such as hydrochloric acid, nitric acid and sulfuric acid, and an organic acid such as formic acid, oxalic acid and acetic acid. These acids may be used alone or in a mixture. In the polycondensation reaction of the present invention, a reaction solvent may not be used generally, it may be used. Examples of these solvents include alcohols such as methanol, ethanol and propanol, ethers such as ethylene glycol dimethyl ether, and diethylene glycol dimethyl ether, and the like. A reaction temperature is selected appropriately depending on the type of a phenolic compound, but is usually from 10° to 200° C., preferably from 20° to 150° C. After the reaction, generally the internal temperature is raised to 150°–250° C. to distill off unreacted starting materials, an acid catalyst and water under reduced pressure, and then melted novolak resin is recovered.

In the case of a reaction using a reaction solvent, the reaction mixture is added to a solvent such as water to precipitate a novolak resin, and the precipitate is then recovered by filtrating and drying.

These novolak resins may be used alone or in a mixture of two or more. A weight average molecular weight of the novolak resin of the present invention is preferably from 2,500 to 30,000. If the weight average molecular weight is less than 2,500, heat resistance of a positive type resist tends to be lowered. On the other hand, the weight average molecular weight exceeds 30,000, sensitivity of the positive-type resist tends to be remarkably lowered, and a resin preferable as an alkali-soluble resin is hardly obtainable.

In the present invention, a quinonediazide type photosensitive compound is a quinonediazide sulfonic acid ester of a polycondensate (d) of at least one phenolic compound (a) of the formula (A) with at least one hydroxy aromatic aldehydes (b) of the formula (B) and at least one carbonyl compounds (c) of the formula (C), and a mixing ratio (mol ratio) of the hydroxy aromatic aldehydes (b)/the carbonyl compounds (c) is from 1/99 to 99/1, and the polycondensate (d) has a weight average molecular weight (based on polystyrene calculation) of from 600 to 2,000.

In the above formulas (A), (B) and (C), $R^1$ is a $C_1$–$C_4$ alkyl group, a $C_1$–$C_4$ alkoxy group or a hydroxyl group, $R^2$ is a $C_1$–$C_4$ alkyl group or a $C_1$–$C_4$ alkoxy group, $R^3$ and $R^4$ are respectively a hydrogen atom, a $C_1$–$C_4$ alkyl group, an aryl group or an aralkyl group, l is an integer of from 0 to 3, m is an integer of from 0 to 4, n is an integer of from 1 to 5, and the total number of m and n is not more than 5, provided that plural $R^1$ or $R^2$ may be respectively the same or different when l or m is an integer of at least 2.

Examples of the $C_1$–$C_4$ lower alkyl group include a methyl group, an ethyl group, an n-propyl group, an i-propyl group, an n-butyl group and the like; examples of the $C_1$–$C_4$ lower alkoxy group include a methoxy group, an ethoxy group, an n-propoxy group, an n-butyl group and the like; examples of the aryl group include a phenyl group and the like; and examples of the aralkyl group include a benzyl group and the like.

Examples of the phenolic compound (a) of the formula (A) include phenol, o-cresol, m-cresol, p-cresol, 3,5-xylenol, 2,5-xylenol, 2,3-xylenol, 3,4-xylenol, 2,3,5-trimethylphenol, 3,4,5-trimethylphenol, 2-t-butylphenol, 3-t-butylphenol, 4-t-butylphenol, resorcinol, 2-methylresorcinol, 4-methylresorcinol, 5-methylresorcinol, catechol, 4-t-butylcatechol, pyrogallol, 2-methoxyphenol, 3-methoxyphenol, 4-methoxyphenol, 2-methoxyresorcinol, 2,3-dimethoxyphenol, 2,5-dimethoxyphenol, 3,5-dimethoxyphenol, 2-ethylphenol, 3-ethylphenol, 4-ethylphenol, 2,3,5-triethylphenol, 3,4,5-triethylphenol, 2,3-diethylphenol, 3,5-diethylphenol, 2-isopropylphenol, 3-isopropylphenol, 4-isopropylphenol, 2-propylphenol, 3-propylphenol, 4-propylphenol, 2-methoxy-5-methylphenol, 2-t-butyl-5-methylphenol, and the like, and these compounds may be used alone or in a mixture of two or more.

In the formula (A), $R^1$ is preferably a $C_1$-$C_2$ alkyl group or a hydroxy group. If the carbon number of $R^1$ is large, heat resistance and sensitivity tend to be degraded. Preferable examples of the phenolic compound of the formula (A) include phenol, o-cresol, m-cresol, p-cresol, 3,5-xylenol, 2,5-xylenol, 2,3-xylenol, 3,4-xylenol, resorcinol, 2-methylresorcinol and pyrogallol, and more preferable examples include m-cresol, p-cresol, 3,5-xylenol, 2,5-xylenol, 3,4-xylenol, resorcinol and 2-methylresorcinol.

Most preferably, in the formula (A), $R^1$ is a methyl group or a hydroxyl group, and l is 1 or 2.

On the other hand, examples of the hydroxy aromatic aldehydes (b) of the formula (B) include o-hydroxybenzaldehyde, m-hydroxybenzaldehyde, p-hydroxybenaldehyde, vanillin, o-vanillin, 4-hydroxy-3-methylbenzaldehyde, 2,3-dihydroxybenzaldehyde, 2,4-dihydroxybenzaldehyde, 2,5-dihydroxybenzaldehyde, 3,4-dihydroxybenzaldehyde, 2-hydroxy-4-methoxybenzaldehyde, 2-hydroxy-5-methoxybenzaldehyde, 3-hydroxy-4-methoxybenzaldhyde, 5-hydroxy-4-methoxybenzaldehyde, and the like. These hydroxy aromatic aldehyde (b) of the formula (B) may be used alone or in a mixture of two or more compounds in an optional ratio.

In the formula (B), $R^2$ is preferably a $C_1$-$C_2$ alkyl or methoxy group, and m is preferably an integer of from 0 to 2, more preferably 0 or 1, and n is preferably an integer of 1 or 2. Most preferably, in the formula (B), m is 0 and n is 1.

Examples of the carbonyl compounds (c) of the formula (C) include aldehydes such as formaldehyde, alkyl aldehydes including acetaldehyde, paraaldehyde, propionaldehyde, butyraldehyde and the like, benzaldehyde, phenylacetaldehyde and the like, and also ketones including acetone, ethyl methyl ketone, acetophenone, benzophenone and the like. Among these carbonyl compounds, preferable examples include alkyl aldehydes having a total carbon number of from 2 to 5, benzaldehyde and acetone, and more preferable examples include an alkylaldehyde having a total carbon number of from 2 to 3, and benzaldehyde. In the case of an alkylaldehyde having a total carbon number of at least 5, sensitivity and heat resistance tend to be lowered. These carbonyl compounds (c) of the formula (C) may be used alone or in a mixture of an optional mixing ratio. In the case that $R^3$ and/or $R^4$ represent an aryl group, the aryl group does not have a hydroxy substituent.

In the present invention, the hydroxy aromatic aldehydes (b) of the formula (B) is mixed with the carbonyl compounds (c) of the formula (C) in a mol ratio (b)/(c) of from 1/99 to 99/1. The lower limit of (b)/(c) is preferably at least 20/80, more preferably at least 30/70, most preferably at least 40/60, and on the other hand, the upper limit of (b)/(c) is preferably not higher than 95/5, more preferably not higher than 90/10.

If the amount of the hydroxy aromatic aldehydes of the formula (B) is too large, resolution tends to be lowered. On the other hand, if the amount of the hydroxy aromatic aldehydes of the formula (B) is too small, improvement of heat resistance is poor and sensitivity is liable to be lowered. Further, if the amount of the hydroxy aromatic aldehydes of the formula (B) is too large or too small, the formed photoresist pattern size tends to be inaccurate and the accuracy of the formed photoresist pattern size tends to be unfavorably affected depending on the kinds of pattern mask. The above-mentioned mixing ratio of (b) and (c) means the total mixing molar ratio of the hydroxy aromatic aldehydes (b) of the formula (B) and the total mixing molar ratio of the carbonyl compounds (c) of the formula (C).

A polycondensate (d) can be prepared from the above mentioned phenolic compound (a) with the hydroxy aromatic aldehydes (b) of the formula (B) and the carbonyl compounds (c) of the formula (C) in the same manner as in the preparation of the above-mentioned alkali-soluble resin as a base resin. A weight average molecular weight of the polycondensate (d) is from 600 to 2,000, preferably from 700 to 1,500. If the molecular weight of the polycondensate (d) is too small, a satisfactory masking effect can not be obtained and a satisfactory pattern profile can not be obtained. On the other hand, if the molecular weight of the polycondensate (d) is too large, sensitivity is remarkably degraded.

Examples of a quinonediazide sulfonyl group in a quinonediazide sulfonate of the polycondensate (d) include a 1,2-benzoquinonediazide-4-sulfonyl group, a 1,2-naphthoquinonediazide-4-sulfonyl group, a 1,2-naphthoquinonediazide-5-sulfonyl group, and the like. The esterification rate of a quinonediazide sulfonate of the polycondensate (d), i.e. the substitution rate of the quinonediazide sulfonyl group to hydrogen of a hydroxyl group of the polycondensate (d) [(number of quinonediazide sulfonyl groups per molecule of quinonediazide sulfonic acid esterification product of polycondensate (d))×100/(number of hydroxyl groups per molecule of polycondensate (d)], is from 15 to 100%, preferably from 25 to 80%.

The esterification reaction of the polycondensate (d) is conducted by reacting the polycondensate (d) with a quinonediazide sulfonyl chloride such as 1,2-benzoquinonediazide-4-sulfonyl chloride, 1,2-naphthoquinonediazide-4-sulfonyl chloride or 1,2-naphthoquononediazide-5-sulfonyl chloride, in an organic solvent at room temperature.

In the present invention, a compound having a quinonediazide group bonded to the polycondensate (d) prepared from the above-mentioned specific starting materials, is used as a photosensitive compound, and one or more photosensitive compounds defined in the present invention can be used in the present invention. Also, within the scope of not damaging the effect of the present invention, other photosensitive compounds may be used in combination therewith.

Any solvent may be used for this purpose in the present invention, provided that it dissolves the above-mentioned quinonediazide type photosensitive compounds and the alkali-soluble resin, but a preferable solvent should have a boiling point of from 100° to 180° C. in view of ordinary operation conditions. Examples of these solvents include glycolic acid ester derivatives such as methyl lactate, ethyl lactate and ethyl glycolate, glycol ether ester derivatives such as ethyl cellosolve acetate, methyl cellosolve acetate and propylene glycol monomethyl ether acetate, ketone esters such as methyl pyruvate and ethyl pyruvate, alkoxy carboxylic acid esters such as methyl 3-methoxypropionate and ethyl 3-ethoxy propionate, ketone derivatives such as acetyl acetone, cyclopentanone, cyclohexanone and 2-heptanone, ketone ether derivatives such as diacetone alcohol methyl ether, ketone alcohol derivatives such as acetol and diacetone alcohol, amino derivatives such as dimethyl acetoamide and dimethylformamide, ether derivatives such as anisole and diethylene glycol dimethyl ether, and the like. Also, if necessary, a mixed solvent containing xylene, butyl acetate or the like may be used. Among them, in view of reservation stability, film uniformity, safety and easy handling, a mixed solvent containing methyl 3-methoxypropionate, methyl lactate, ethyl lactate or 2-heptanone as the main components is preferable.

The concentration of the alkali-soluble resin in the photoresist composition of the present invention is generally from 1 to 30 wt %, and the concentration of the quinonediazide type photosensitive compound is from 0.1 to 15 wt %. Also, the weight ratio of the quinonediazide type photosensitive compound/the alkali-soluble resin is from 0.1/1 to 1.0/1.

The photosensitive resin composition of the present invention may further contain a surface active agent in order to improve coating property. A preferable example of the surface active agent is a fluorine type surface active agent. Also, the photosensitive resin composition of the present invention may further contain a light-absorbing material to prevent influence of diffused reflection light from a substrate and also a sensitizer to improve sensitivity.

In the preparation of IC, impurities such as a trace metal and halogen contained in the starting materials should be as little as possible. Accordingly, for this purpose, a photosensitive resin composition may be prepared by mixing each starting material previously purified by an ion exchange method or the like, or after preparing a photosensitive resin composition by mixing each starting material, the photosensitive resin composition may be subjected to purification by an ion exchange method or the like. Also, it is usual that the materials to be used for preparing integrated circuits, are filtrated by a filter having pores of submicrometer. As a radiation, it is preferable to use a light having a wavelength of from 300 to 500 nm such as g-ray (436 nm), i-ray (365 nm), and the like.

The photoresist composition of the present invention is coated on a substrate, exposed to light and developed in a well known manner in each step. An example of the substrate to be coated with the photoresist composition of the present invention includes a semiconductor substrate such as silicon wafer. The photoresist composition is coated on such a substrate usually by a spin coater, and the coating thickness of the photoresist composition is usually from 0.3 to 5 µm. After coating the photoresist composition on a substrate, the substrate having the photoresist composition coated is heated on a hot plate to remove a solvent and is exposed to light through a mask to form a desired pattern on the substrate. The exposing light used is preferably a light having a wavelength in the range of from 300 to 500 nm such as g-ray (436 nm) or i-ray (365 nm). If necessary, after exposing to light, the substrate is heated at 90°–120° C. for 60–120 seconds and is developed by an alkali aqueous solution. Examples of the alkali aqueous solution include inorganic alkali solutions such as potassium hydroxide, potassium carbonate, sodium silicate, sodium metasilicate and aqueous ammonia, and aqueous solutions of primary amines including ethylamine, n-propylamine or the like, secondary amines including diethylamine, di-n-propylamine or the like, tertiary amines including trimethylamine, triethylamine or the like, and quaternary ammonium bases including tetramethyl ammonium hydroxide, trimethylhydroxyethyl ammonium hydroxide or the like. If necessary, an alcohol, a surface active agent or the like may be added to the developer.

The photosensitive resin composition of the present invention has a high sensitivity and a high resolution, and a size of the resist pattern obtained by using the present photosensitive resin composition is accurate regardless of the kind of mask pattern. That is, lines having the same line width on a mask are accurately reproduced on a resist pattern without causing a substantial difference between dense line width and isolated line width, and a predetermined aimed photoresist pattern is accurately formed. Thus, the photosensitive resin composition of the present invention is particularly useful as a photoresist for minute processing.

EXAMPLES

Hereinafter, the present invention is further illustrated by the following Examples, but should not be limited thereto. In the following Examples, a molecular weight is a weight average molecular weight in terms of polystyrene calculation, the values of which are obtained by gel permeation chromatography analysis, and an esterification rate is that determined from a charged mol ratio.

Novolak Resin Synthesis Example 1

In a separable flask of 1 l, were charged 237.9 g of m-cresol, 190.3 g of p-cresol, 53.7 g of 2,5-xylenol, 15 g of oxalic acid dihydrate and 1 ml of 35% hydrochloric acid, and the content is heated to an inner temperature of 95° C. while stirring, and 31.8 g of 90% acetaldehyde was dropwise added thereto to react for 2 hours at the same temperature, and thereafter 211.4 g of 37% formalin aqueous solution was dropwise added thereto while maintaining the same temperature to react for 5 hours. Thereafter, the inner temperature is raised to 180° C. for 1.5 hours to distill water out of the reaction system. After distillation, the inner temperature was further raised to 195° C., and unreacted monomers are distilled off under a reduced pressure of 20 torr to obtain a novolak resin (k) having a molecular weight of 3,500.

Ballast Resin Synthesis Example 1

In a 4-forked flask of 300 ml, were charged 75.6 g of m-cresol, 32.03 g of 2-hydroxybenzaldehyde, 1.5 ml of 35% hydrochloric acid and 120 g of ethanol, and 12.83 g of 90% acetaldehyde was dropwise added thereto under stirring at room temperature, and thereafter reaction was conducted by heat-refluxing for 8 hours while maintaining an oil bath temperature at 100° C. After the reaction, 120 g of ethanol was added to the reaction liquor, and the reaction liquor was dropwise added to 4 l of water under stirring to precipitate a crystallized material. The crystallized material thus obtained was filtrated, and was washed with 2 l of water 3 times, and was dried to obtain a novolak resin (a). The novolak resin (a) thus obtained had a molecular weight of 1060. The acetaldehyde/2-hydroxybenzaldehyde ratio (charged mol ratio) was 5/5.

Ballast Resin Synthesis Example 2

A novolak resin (b) was obtained in the same manner as in Ballast Resin Synthesis Example 1, except that 32.03 g of 4-hydroxybenzaldehyde was used in place of 2-hydroxybenzaldehyde. The novolak resin (b) thus obtained had a molecular weight of 950. The acetaldehyde/4-hydroxybenzaldehyde (charged mol ratio) was 5/5.

Ballast Resin Synthesis Example 3

In a four-forked flask of 200 ml, were charged 21.6 g of m-cresol, 18.3 g of 2-hydroxybenzaldehyde, 0.5 ml of 35% hydrochloric acid and 50 ml of ethanol, and reaction was conducted by heat-refluxing for 7 hours while maintaining an oil bath temperature at 100° C. After the reaction, the reaction liquor was dropwise added to 1 l of water while stirring to precipitate a crystallized material. The crystallized material thus obtained was filtrated, and was then washed with 1 l of water 3 times, and was dried to obtain a novolak resin (c). The novolak resin (c) thus obtained had a molecular weight of 950.

Ballast Resin Synthesis Example 4

A novolak resin (d) was obtained in the same manner as in Ballast Resin Synthesis Example 3, except that 18.3 g of 4-hydroxybenzaldehyde was used in place of 2-hydroxybenzaldehyde. The novolak resin (d) thus obtained had a molecular weight of 720.

Ballast Resin Synthesis Example 5

In a round bottom type flask of 1 l, were charged 324 g of m-cresol, 30 g of oxalic acid dihydrate, 3 ml of 35% hydrochloric acid and 300 ml of ethanol, and 117.5 g of 90% acetaldehyde was dropwise added thereto while stirring at room temperature, and thereafter reaction was conducted by heat-refluxing for 5 hours while maintaining an oil bath temperature at 100° C. After the reaction, the reaction liquor was diluted with 300 ml of ethanol, and was dropwise added to 3 l of water to precipitate a crystallized material. The crystallized material thus obtained was filtrated, and was washed with 3 l of water 3 times, and was dried to obtain a novolak resin (e). The ballast resin (e) thus obtained had a molecular weight of 1058.

Photosensitive Material Synthesis Example 1

21.24 g of the novolak resin (a) and 20.64 g of 1,2-naphtoquinonediazide-5-sulfonyl chloride were charged in a 4-forked flask of 300 ml, and were dissolved in a mixed solvent of 93 g of acetone and 33 g of N-methylpyrrolidone, and 7.65 g of triethylamine was dropwise added thereto, and reaction was conducted at room temperature for 2 hours, and the reaction liquor was filtrated to remove triethylamine hydrochloric acid salt. The filtrate was added to 1 l of water while stirring to precipitate a crystallized material, and the crystallized material thus precipitated was filtrated, washed with water and dried to obtain a photosensitive material (P-1). The photosensitive material (P-1) thus obtained had an esterification rate of 43%.

Photosensitive Material Synthesis Example 2

A photosensitive material (P-2) was obtained in the same manner as in Photosensitive Material Synthesis Example 1, except that 23.65 g of the novolak resin (b) and 22.94 g of 1,2-naphtoquinonediazide-5-sulfonyl chloride were dissolved in a mixed solvent of 104 g of acetone and 36 g of N-methylpyrrolidone, and 8.50 g of triethylamine was dropwise added thereto. The photosensitive material (P-2) thus obtained had an esterification rate of 43%.

Photosensitive Material Synthesis Example 3

A photosensitive material (P-3) was obtained in the same manner as in Photosensitive Material Synthesis Example 1, except that 22.98 g of the novolak resin (c) and 23.51 g of 1,2-naphthoquinonediazide-5-sulfonyl chloride were dissolved in a mixed solvent of 104 g of acetone and 36 g of N-methylpyrrolidone, and 8.96 g of triethylamine was dropwise added thereto. The photosensitive material (P-3) thus obtained had an esterification rate of 43%.

Photosensitive Material Synthesis Example 4

A photosensitive material (P-4) was obtained in the same manner as in Photosensitive Material Synthesis Example 1, except that 23.73 g of the novolak resin (d) and 24.43 g of 1,2-naphthoquinonediazide-5-sulfonyl chloride were dissolved in a mixed solvent of 107 g of acetone and 38 g of N-methylpyrrolidone, and 9.31 g of triethylamine was dropwise added thereto. The photosensitive material (P-4) thus obtained had an esterification rate of 43%.

Photosensitive Material Synthesis Example 5

31.7 g of the novolak resin (e) and 29.0 g of 1,2-naphthoquinonediazide-5-sulfonyl chloride were charged in a four-forked flask of 300 ml, and were dissolved in a mixed solvent of 160 ml of acetone and 44 ml of N-methylpyrrolidone, and 11.7 g of triethylamine was dropwise added thereto, and reaction was conducted at room temperature for 2 hours, and the reaction liquor was filtrated to remove triethylamine hydrochloric acid salt. The filtrate was added to 1 l of water while stirring to precipitate a crystallized material, and the crystallized material thus precipitated was filtrated, washed with water and dried to obtain a photosensitive material (P-5). The photosensitive material (P-5) thus obtained had an esterification rate of 40%.

Photoresist Composition Preparation Example 1

A photoresist composition (PR-1) was obtained by dissolving 6.39 g of the novolak resin (k) as an alkali-soluble resin and 2.81 g of the photosensitive material (P-1) in 30.8 g of a mixed solvent of ethyl lactate/butyl acetate (weight ratio 9/1) and filtrating the solution to a membrane filter having a pore diameter of 0.2 μm.

Photoresist Composition Preparation Examples 2–5

Photoresist compositions (PR-2) to (PR-5) were obtained in the same manner as in Photoresist Composition Preparation Example 1, except that the alkali-soluble resin and the photosensitive materials as shown in the following Table 1 were used in such specific combinations as shown in Table 1.

Examples 1 to 2 and Comparative Examples 1 to 3.

The above prepared photoresist compositions (PR-1) to (PR-5) were subjected to patterning process in accordance with the following patterning methods, and were then evaluated in respect of sensitivity, limiting resolution, heat resistance and CD difference, and the results are shown in the following Table 2. The following marks and terms in Table 2 are illustrated hereinafter.

Eth: Minimum light-exposure amount (expressed by exposure time) necessary for completely dissolving a light-exposed part of 2 mm×2 mm square to a substrate in an alkali developer.

Eo: Light-exposure amount (expressed by exposure time) necessary for exposing through a 0.5 μm width-line and space (1:1) pattern of a mask and developing the exposed pattern in an alkali developer to obtain an accurately reproduced 0.5 μm width-unexposed part (line) and exposed part (space) (1:1) pattern.

Limiting resolution: Expressed by size of minimum line and space pattern resoluble at light-exposure amount Eo.

Heat resistance: Expressed by maximum temperature (measured by 5° C. interval) at which a 5 μm width-line and space pattern does not deform when a wafer is heated on a hot plate for 5 minutes.

ΔCD: Difference between a photoresist line width (LEo (=0.5 μm)) obtained by means of a mask having line of a 0.5 μm width and having line and space (1:1) pattern and a photoresist line width (LI) obtained by means of a mask having line of a 0.5 μm width and having line and space (1:9) pattern (provided that the light exposure amount is Eo). ΔCD=LI-LEo

PATTERNING METHOD

A photoresist composition was coated on a silicon wafer by a spin coater and was heated on a hot plate at 90° C. for 60 seconds to remove a solvent, thereby forming a photoresist coating film of 1.07 μm thickness. This was then exposed through a mask with i-ray stepper (NA=0.50) manufactured by Nikon Co., Ltd., and was heated on a hot plate at 110° C. for 60 seconds, and was then bathed in a 2.38% tetramethyl ammonium hydroxide aqueous solution to develop the pattern.

TABLE 1

| | Photo-resist composition No. | Photosensitive material No. | Photosensitive material Esterification rate (%) | Novolak resin No. | Photosensitive material/novolak resin (charged weight ratio) |
|---|---|---|---|---|---|
| Example 1 | PR-1 | P-1 | 43 | (k) | 0.440 |
| Example 2 | PR-2 | P-2 | 43 | (k) | 0.440 |
| Comparative Example 1 | PR-3 | P-3 | 43 | (k) | 0.423 |
| Comparative Example 2 | PR-4 | P-4 | 43 | (k) | 0.421 |
| Comparative Example 3 | PR-5 | P-5 | 40 | (k) | 0.510 |

TABLE 2

| | Photo-resist Composition No. | Eth (msec) | Eo (msec) | Limiting resolution (µ) | Heat resistance (°C.) | ΔCD (µ) |
|---|---|---|---|---|---|---|
| Example 1 | PR-1 | 156 | 306 | 0.34 | 130 | 0.004 |
| Example 2 | PR-2 | 118 | 217 | 0.34 | 130 | 0.003 |
| Comparative Example 1 | PR-3 | 84 | 125 | 0.40 | 135 | 0.038 |
| Comparative Example 2 | PR-4 | 58 | 80 | 0.40 | 130 | 0.042 |
| Comparative Example 3 | PR-5 | 220 | 476 | 0.34 | 120 | 0.032 |

Ballast Resin Synthesis Examples 6 to 7

In a four-forked flask of 1 l, were charged m-cresol, 4-hydroxybenzaldehyde, 35% hydrochloric acid and ethanol respectively in such amounts as shown in the following Table 3, and 90% acetaldehyde of the amount as shown in Table 3 was dropwise added thereto at room temperature under stirring, and reaction was conducted by heat-refluxing at an oil bath temperature of 100° C. for 8 hours. After the reaction, ethanol was charged in the reaction liquor in the same amount as charged in the starting liquor, and the resultant mixture was dropwise added to 10 l of water under stirring to precipitate a crystallized material. The crystallized material thus obtained was filtrated, washed with 5 l of water 3 times and dried to obtain novolak resins (f) and (g).

Ballast Resin Synthesis Examples 8 to 10

In an four-forked flask of 300 ml, were charged m-cresol, 4-hydroxybenzaldehyde, 35% hydrochloric acid and ethanol respectively in such amounts as shown in the following Table 3 and 90% acetaldehyde of the amount as shown in Table 3 was dropwise added thereto at room temperature under stirring, and reaction was conducted by heat-refluxing at an oil bath temperature of 100° C. for 8 hours. After the reaction, ethanol was charged in the reaction liquor in the same amount as charged in the starting liquor, and the resultant mixture was dropwise added to 6 l of water under stirring (in Synthesis Example 10 only, the reaction liquor was dropwise added to 5.5 l of water under stirring) to precipitate a crystallized material. The crystallized material thus obtained was filtrated, washed with 2 l of water twice and dried to obtain novolak resins (h) to (j).

TABLE 3

| Novolak resin | Ballast Resin Synthesis Example | m-cresol amount (g) | 4HBA amount (g) | AD amount (g) | HCl amount (g) | EtOH amount (g) | 4HBA/AD ratio (charged mol ratio) | Molecular weight |
|---|---|---|---|---|---|---|---|---|
| (f) | 6 | 216 | 36.6 | 58.67 | 4 | 343 | 2/8 | 948 |
| (g) | 7 | 216 | 64.05 | 47.67 | 4 | 343 | 3.5/6.5 | 895 |
| (h) | 8 | 108 | 59.48 | 12.83 | 2 | 179 | 6.5/3.5 | 853 |
| (i) | 9 | 108 | 73.2 | 7.33 | 2 | 188 | 8/2 | 889 |
| (j) | 10 | 108 | 82.43 | 3.67 | 2 | 194 | 9/1 | 895 |

HBA: 4-hydroxybenzaldehyde
AD: acetaldehyde
EtOH: ethyl alcohol

Photosensitive Material Synthesis Examples 6 to 10

Photosensitive materials (P-6) to (P-10) as shown in the following Table 4 were prepared in the same manner as in Photosensitive Material Synthesis Example 1, except that the types and the amounts of novolak resins used are shown in Table 4 and 1,2-quinonediazide-5-sulfonyl chloride, acetone, N-methylpyrrolidone and triethylamine were used respectively in such amounts as shown in Table 4.

TABLE 4

| Photo-sensitive material | Novolak resin Type | Novolak resin Amount (g) | 1,2-quinone-diazide-5-sulfonyl chloride (g) | Acetone (g) | NMP (g) | Et$_3$N (g) | Esterification rate (%) |
|---|---|---|---|---|---|---|---|
| (P-6) | (f) | 23.70 | 21.72 | 100.8 | 35.4 | 8.84 | 42 |
| (P-7) | (g) | 22.38 | 21.44 | 97.3 | 34.2 | 8.48 | 42 |
| (P-8) | (h) | 21.33 | 22.97 | 98.4 | 34.6 | 9.09 | 45 |
| (P-9) | (i) | 22.23 | 24.79 | 104.4 | 36.7 | 9.80 | 45 |
| (P-10) | (j) | 22.38 | 25.10 | 105.4 | 37.0 | 9.92 | 45 |

NMP: N-methyl pyrrolidone
Et$_3$N: triethyl amine

Photoresist Composition Preparation Examples 6 to 10

Photoresist compositions (PR-6) to (PR-10) were prepared in the same manner as in Photoresist Composition Preparation Example 1, except that the alkali-soluble resins and the photosensitive materials as shown in the following Table 5 were used in such combinations as shown in Table 5.

TABLE 5

| Photoresist Composition Preparation Example | Photoresist composition No. | Photosensitive material No. | Esterification rate (%) | Novolak resin No. | Photosensitive material/ novolak resin (charged weight ratio) |
|---|---|---|---|---|---|
| 6 | PR-6 | P-6 | 42 | (k) | 0.460 |
| 7 | PR-7 | P-7 | 42 | (k) | 0.444 |
| 8 | PR-8 | P-8 | 45 | (k) | 0.406 |
| 9 | PR-9 | P-9 | 45 | (k) | 0.397 |
| 10 | PR-10 | P-10 | 45 | (k) | 0.391 |

Comparative Example 4 and Examples 3 to 6

The above prepared photoresist compositions (PR-6) to (PR-10) were evaluated in the same manner as in Example 1, and the results are shown in the following Table 6.

TABLE 6

| | Photoresist Composition No. | Eth (msec) | Eo (msec) | Limiting resolution (μ) | Heat resistance (°C.) | ΔCD (μ) |
|---|---|---|---|---|---|---|
| Comparative Example 4 | PR-6 | 170 | 332 | 0.34 | 125 | 0.015 |
| Example 3 | PR-7 | 125 | 237 | 0.34 | 130 | 0.007 |
| Example 4 | PR-8 | 100 | 172 | 0.34 | 130 | 0.005 |
| Example 5 | PR-9 | 90 | 142 | 0.36 | 130 | 0.005 |
| Example 6 | PR-10 | 78 | 111 | 0.36 | 130 | 0.006 |

We claim:

1. A photosensitive resin composition comprising an alkali-soluble resin, a quinonediazide photosensitive compound and a solvent, in which the quinonediazide photosensitive compound contains a quinonediazide sulfonic acid ester of a polycondensate (d) of at least one phenolic compound (a) of the formula (A) with at least one hydroxy aromatic aldehyde (b) of the formula (B) and at least one carbonyl compound (c) of the formula (C), and the mixing ratio ((b)/(c) mol ratio) of the hydroxy aromatic aldehydes (b)/the carbonyl compounds (c) is from 30/70 to 99/1, and the polycondensate (d) has a weight average molecular weight of from 700 to 1,500 in terms of polystyrene calculation:

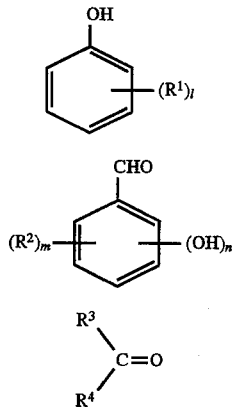

(wherein $R^1$ is an alkyl group having a carbon number of from 1 to 4, an alkoxy group having a carbon number of from 1 to 4 or a hydroxyl group, $R^2$ is an alkyl group having a carbon number of from 1 to 4 or an alkoxy group having a carbon number of from 1 to 4, $R^3$ and $R^4$ are respectively a hydrogen atom, an alkyl group having a carbon number of from 1 to 4, an aryl group or an aralkyl group, l is an integer of from 0 to 3, m is an integer of from 0 to 4, n is an integer of from 1 to 5, and the total number of m and n is not more than 5, provided that plural $R^1$ or $R^2$ may be respectively the same or different when l or m is an integer of at least 2).

2. The photosensitive resin composition according to claim 1, wherein the (b)/(c) mol ratio is from 30/70 to 95/5.

3. The photosensitive resin composition according to claim 1, wherein $R^1$ in the formula (A) is an alkyl group having a carbon number of from 1 to 2 or a hydroxy group.

4. The photosensitive resin composition according to claim 1, wherein $R^1$ is a methyl group or a hydroxy group and l is 1 or 2 in the formula (A).

5. The photosensitive resin composition according to claim 1, wherein $R^2$ is an alkyl group having a carbon number of from 1 to 2 or a methoxy group and m is an integer of from 0 to 2 in the formula (B).

6. The photosensitive resin composition according to claim 5, wherein m is 0 and n is 1 in the formula (B).

7. The photosensitive resin composition according to claim 1, wherein the carbonyl compounds (c) of the formula (C) are at least one member selected from the group consisting of alkylaldehydes having a carbon number from 1 to 4, benzaldehyde and acetone.

8. The photosensitive resin composition according to claim 1, wherein the alkali-soluble resin is a novolak resin.

9. The photosensitive resin composition according to claim 1, wherein the concentration of the alkali-soluble resin is from 1 to 30 wt %, the concentration of the quinonediazide photosensitive compound is from 0.1 to 15 wt %, and the weight ratio of the quinonediazide type photosensitive compound/the alkali-soluble resin is from 0.1/1 to 1.0/1.

10. A method for forming a photoresist pattern comprising the steps of coating a photosensitive resin composition on a substrate, exposing the substrate to light and developing the substrate, characterized in that the photosensitive resin composition comprising an alkali-soluble resin, a quinonediazide photosensitive compound and a solvent, in which the quinonediazide photosensitive compound contains a quinonediazide sulfonic acid ester of a polycondensate (d) of at least one phenolic compound (a) of the formula (A) with at least one hydroxy aromatic aldehyde (b) of the formula (B) and at least one carbonyl compound (c) of the formula (C), and the mixing ratio ((b)/(c) mol ratio) of the hydroxy aromatic aldehydes (b)/the carbonyl compounds (c) is from 30/70 to 99/1, and the polycondensate (d) has a weight average molecular weight of from 700 to 1,500 in terms of polystyrene calculation:

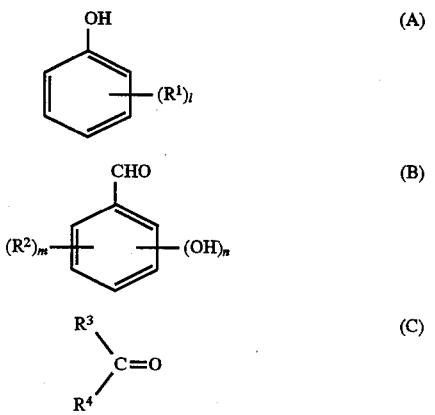

(wherein $R^1$ is an alkyl group having a carbon number of from 1 to 4, an alkoxy group having a carbon number of from 1 to 4 or a hydroxyl group, $R^2$ is an alkyl group having a carbon number of from 1 to 4 or an alkoxy group having a carbon number of from 1 to 4, $R^3$ and $R^4$ are respectively a hydrogen atom, an alkyl group having a carbon number of from 1 to 4, an aryl group or an aralkyl group, l is an integer of from 0 to 3, m is an integer of from 0 to 4, n is an integer of from 1 to 5, and the total number of m and n is not more than 5, provided that plural $R^1$ or $R^2$ may be respectively the same or different when l or m is an integer of at least 2).

* * * * *